United States Patent
Chang et al.

(10) Patent No.: US 12,301,257 B2
(45) Date of Patent: May 13, 2025

(54) AUTOMATIC STABILIZATION OF ENCODERS

(71) Applicant: Avago Technologies International Sales Pte. Limited, Singapore (SG)

(72) Inventors: Childs Chang, Penang (MY); Kheng Hin Toh, Penang (MY); Heem Leong Ong, Penang (MY); Wei Keat Yew, Pulau Pinang (MY); Thomas Theil, Feldafing (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/466,811

(22) Filed: Sep. 13, 2023

(65) Prior Publication Data

US 2025/0088204 A1 Mar. 13, 2025

(51) Int. Cl.
*H03M 13/19* (2006.01)
*H03M 13/00* (2006.01)

(52) U.S. Cl.
CPC ......... *H03M 13/19* (2013.01); *H03M 13/611* (2013.01)

(58) Field of Classification Search
CPC .............................. H03M 13/19; H03M 13/611
See application file for complete search history.

(56) References Cited

U.S. PATENT DOCUMENTS

| | | | |
|---|---|---|---|
| 5,138,564 A | 8/1992 | de Jong et al. | |
| 6,145,368 A | 11/2000 | Klein | |
| 6,598,196 B1 | 7/2003 | Bussard et al. | |
| 7,109,900 B2 | 9/2006 | Kiriyama et al. | |
| 7,250,881 B2 | 7/2007 | Kiriyama et al. | |
| 7,492,150 B2 | 2/2009 | Buehhold | |
| 11,243,101 B2 | 2/2022 | Kettering | |
| 2010/0045219 A1* | 2/2010 | Ajima | H02P 6/10 318/400.38 |

(Continued)

FOREIGN PATENT DOCUMENTS

| | | |
|---|---|---|
| DE | 102015216806 A1 | 3/2017 |
| EP | 3504515 B1 | 7/2019 |
| JP | 2005-024398 A | 2/2005 |

(Continued)

OTHER PUBLICATIONS

Automatic Calibration of Encoders Based on Temperature 24 pages Date: Sep. 13, 2023.
Automatic Calibration of Encoders 39 pages Sep. 13, 2020.

*Primary Examiner* — Thien Nguyen
(74) *Attorney, Agent, or Firm* — Quarles & Brady LLP

(57) ABSTRACT

Novel tools and techniques are provided for implementing an encoder capable of performing a self-correction process, and more particularly methods, systems, and apparatuses are provided for implementing an encoder capable of performing a process to correct itself during operation of the encoder. In various embodiments, the encoder includes an exciter and a sensor capable of detecting a position of the exciter and generating a signal based on the position of the exciter. The encoder can then perform one or more steps to detect at least one of a first error in an offset of the signal, a second error in a gain of the signal, or a third error in a phase of the signal as the exciter is rotating and correct the signal from the sensor based on the detection of at least one of the first error, the second error, or the third error.

20 Claims, 9 Drawing Sheets

(56) References Cited

U.S. PATENT DOCUMENTS

2010/0312514 A1 12/2010 Bonato et al.
2021/0285802 A1* 9/2021 Loeken .................. G01D 18/00

FOREIGN PATENT DOCUMENTS

| JP | 2006-018709 | 1/2006 |
| JP | 2009-123360 | 6/2009 |
| WO | WO-2014/188894 A1 | 11/2014 |

* cited by examiner

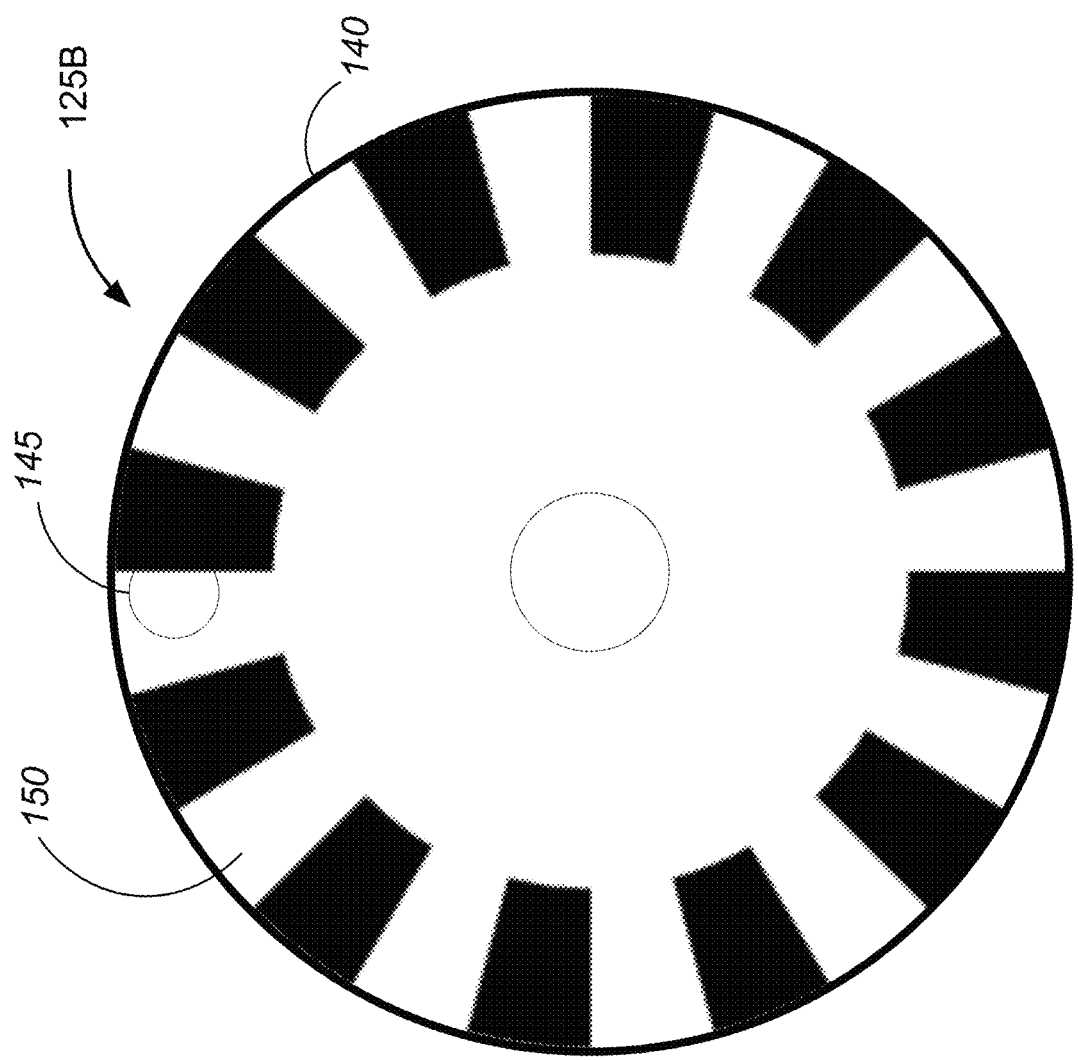

AUTOMATIC STABILIZATION OF ENCODERS

CROSS-REFERENCES TO RELATED APPLICATIONS

The present application is related to U.S. application Ser. No. 18/466,801, entitled "Automatic Calibration of Encoders", filed Sep. 13, 2023, and to U.S. application Ser. No. 18/466,817, entitled "Automatic Calibration of Encoders Based on Temperature", filed Sep. 13, 2023, which are commonly owned and incorporated by reference herein for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for implementing correction of an encoder, and more particularly to methods, systems, and apparatuses for implementing correction of a signal of the encoder.

BACKGROUND

Most types of encoders need to be calibrated before the encoders are used. The calibration of an encoder is typically only performed once in an encoder's lifetime (e.g., upon first setup of the encoder). In order to calibrate an encoder, a reference encoder is typically needed. The reference encoder is an extra encoder that has already been calibrated. The signals of the reference encoder are compared to the signals from the encoder. The encoder's signals are then corrected based on the comparison of the encoder's signal to the reference encoder's signal to determine the encoder's angular position. However, this calibration process with the reference encoder can typically only be performed once in factory because, once the encoder is calibrated, the reference encoder is removed and then the encoder is shipped from the factory to a customer.

Hence, there is a need for more robust and scalable solutions for implementing correction of an encoder. Thus, methods, systems, and apparatuses for implementing correction of a position of an exciter of the encoder are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 2B is a top view of an exciter of an optical encoder, in accordance with various embodiments;

DETAILED DESCRIPTION OF EMBODIMENTS

Figure 1:
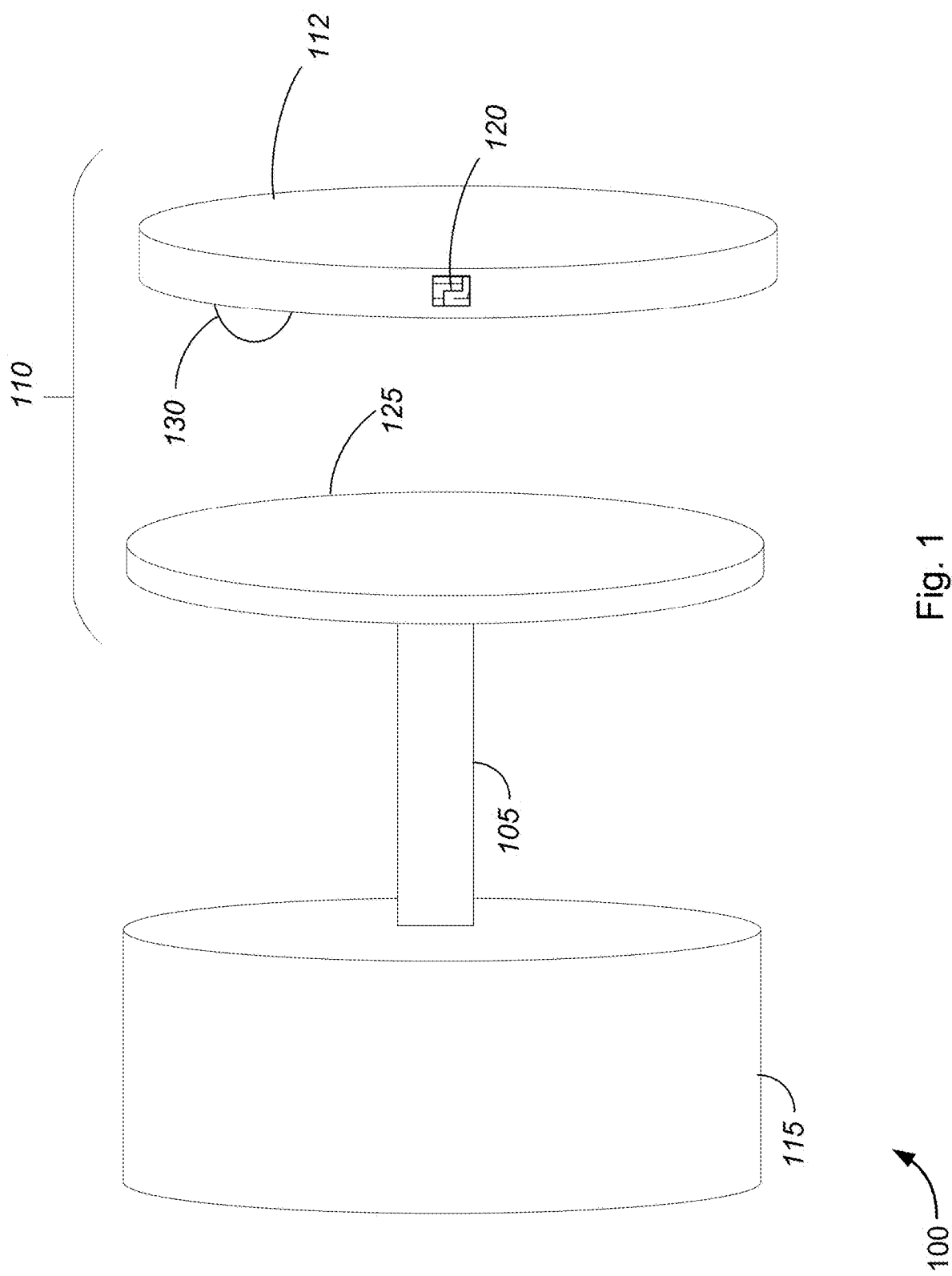
FIG. 1 is perspective view of a system having an encoder, in accordance with various embodiments.

Various embodiments provide tools and techniques for implementing an encoder capable of correcting or stabilizing itself. More particularly, methods, systems, and apparatuses are provided for implementing correction of a signal of the encoder.

In a first aspect, an encoder includes an exciter and a sensor configured to detect a position associated with the exciter and generate a signal based on the position, and a controller. The controller is further configured to receive the signal from the sensor; detect, as the exciter is rotating, at least one of a first error in an offset of the signal, a second error in a gain of the signal, and a third error in a phase of the signal from the sensor; based on the detection of at least one of the first error, the second error, or the third error, calculate at least one of a first value to correct the offset of the signal, a second value to correct the gain of the signal, and a third value to correct the phase of the signal; and correct the signal based on at least one of the first value, the second value, or the third value.

In various cases, the detection of at least one of the first error, the second error, or the third error in the rotation of the exciter, the calculation of at least one of the first value, the second value, or the third value to correct the signal, and the correction of the signal occurs (in real time) as the exciter is rotating. In some cases, correcting the signal based on at least one of the first value, the second value, or the third value occurs over a predetermined amount of time. In some instances, correcting the signal based on at least one of the first value, the second value, or the third value occurs over a predetermined number of rotations of the exciter. In various embodiments, correcting the signal based on at least one of the first value, the second value, or the third value comprises dividing at least one of the first value, the second value, or the third value and correcting the signal over a predetermined number of rotations based on the dividing of the least one of the first value, the second value, or the third value.

In some embodiments, detection of the error in the rotation of the exciter and the calculation of the first value to correct the signal occurs after a calibration of the encoder. In various instances, at least one of the first value, the second value, or the third value is combined with a corresponding value determined by a calibration of the encoder. The first value can be combined with the corresponding value determined by the calibration of the encoder over a predetermined amount of time or a predetermined number of rotations.

In some instances, the detection of at least one of the first error, the second error, or the third error comprises detecting the first error, the second error, and the third error, and the correction of the signal comprises first correcting the first error, then correcting the second error, then correcting the third error. In some instances, first correcting the first error, then correcting the second error, the correcting the third error occurs over a predetermined amount of time. In various cases, first correcting the first error, then correcting the second error, the correcting the third error occurs over a predetermined number of rotations.

In various embodiments, detecting at least one of the first error, the second error, or the third error comprises determining based on the signal received from the sensor that the signal and a target signal of the sensor does not match; and based on a determination that the signal and the target signal do not match, detecting at least one of the first error, the second error, or the third error as the exciter is rotating.

In some instances, the controller is further configured to determine at least one of the first error, the second error, or the third error is occurring over a predetermined number of rotation cycles; and based on the determination that at least one of the first error, the second error, or the third error is occurring over the predetermined number of rotation cycles, calculate at least one of the first value, the second value, or the third value to correct the signal to account for the at least one of the first error, the second error, or the third error and correcting the signal based on the at least one of the first value, the second value, or the third value.

In some cases, at least one of the first error, the second error, or the third error is detected by combining a peak and valley detection of the signal with a Discrete Fourier Transform (DFT).

In another aspect, a method for correcting an error in a signal of an encoder can include detecting a signal from a sensor of the encoder detecting a position of an exciter of the encoder; detecting, as the exciter is rotating, at least one of a first error in an offset of the signal, a second error in a gain of the signal, or a third error in a phase of the signal from the sensor; based on the detection of at least one of the first error, the second error, or the third error, calculating at least one of a first value to correct the offset of the signal, a second value to correct the gain of the signal, or a third value to correct the phase of the signal; and correcting the signal based on at least one of the first value, the second value, or the third value.

In various cases, the detection of at least one of the first error, the second error, or the third error in the rotation of the exciter, the calculation of at least one of the first value, the second value, or the third value to correct the signal, and the correction of the signal occurs (in real time) as the exciter is rotating. In some cases, correcting the signal based on at least one of the first value, the second value, or the third value occurs over a predetermined amount of time. In some instances, correcting the signal based on at least one of the first value, the second value, or the third value occurs over a predetermined number of rotations of the exciter. In various embodiments, correcting the signal based on at least one of the first value, the second value, or the third value comprises dividing at least one of the first value, the second value, or the third value and correcting the signal over a predetermined number of rotations based on the dividing of the least one of the first value, the second value, or the third value.

In some embodiments, detection of the error in the rotation of the exciter and the calculation of the first value to correct the signal occurs after a calibration of the encoder. In some cases, the detection of at least one of the first error, the second error, or the third error comprises detecting the first error, the second error, and the third error, and wherein the correction of the signal comprises first correcting the first error, then correcting the second error, the correcting the third error.

In yet another aspect, an encoder includes an exciter; a sensor configured to detect a position associated with the exciter and generate a signal based on the position; and a processor. The processor is configured to detect, as the exciter is rotating, at least one of a first error in an offset of the signal, a second error in a gain of the signal, and a third error in a phase of the signal from the sensor; determine at least one of the first error, the second error, or the third error is occurring across two or more rotation cycles; based on a determination that at least one of the first error, the second error, or the third error is occurring across two or more rotation cycles, calculate at least one of a first value to correct the offset of the signal, a second value to correct the gain of the signal, or a third value to correct the phase of the signal; and correct the signal based on at least one of the first value, the second value, or the third value.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Additionally, it should be understood that spatial descriptions (e.g., "above," "below," "up," "left," "right," "down," "top," "bottom," "middle," "vertical," "horizontal," etc.) used herein are for purposes of illustration only, and that practical implementations of the structures described herein can be spatially arranged in any orientation or manner.

In existing encoder calibration processes, an encoder is only calibrated once upon initial setup. However, the angular position and rotation speed of an encoder can vary over time based thermal expansions (e.g., changes in shape, volume, or area in response to temperature change or the like) of the encoder, exciter, motor shaft, or the like at different temperatures, defects (e.g., due to wear and tear, thermal expansion, or the like) occurring in the encoder, exciter, motor shaft over time, or the like. Correcting the signal for the encoder after calibration is typically not feasible because encoders are typically only calibrated when they are first manufactured. Thus, a signal of the encoder after the initial calibration of the encoder can become inaccurate over time as the encoder is used.

The proposed encoder can determine one or more new correction or stabilization values while the encoder is in operation or use. For example, as the position and rotation speed of an exciter of an encoder varies over time due to temperature of an environment surrounding the encoder, thermal expansions of the encoder, exciter, motor shaft, or the like at different temperatures, defects (e.g., due to wear and tear, thermal expansion, or the like) occurring in the encoder, exciter, motor shaft over time, or the like, the encoder can determine one or more new correction or stabilization values and update the look-up table for the encoder based on these changes. Thus, a new calibration cycle does not need to be run for the encoder and the encoder can self-correct itself while the encoder is being used or operated.

FIG. 1 is a perspective view of system 100 including a rotating body 105 and an encoder or encoder system 110, in accordance with various embodiments. The rotating body 105 includes, without limitation, a rotor disc, a shaft, and/or the like. In some cases, the rotating body 105 might be coupled to an optional motor 115 (e.g., electric motor, or the like). The motor 115 may be configured to cause the rotating body 105 to rotate.

In some embodiments, the encoder system 110 includes a housing 112, a processor or controller 120, an exciter 125, a first sensor 130, and a temperature sensor 155. In some cases, the sensor 130 and/or temperature sensor 155 can be integrated within or on or included within or on the housing 112 or the controller 120. In various instances, the encoder 110 further includes a memory (not shown) which could be a non-transitory memory. The memory could be implemented within the controller 120 and/or within the housing 112 of the encoder 110. In various embodiments, the controller 120 may be implemented in a system-on-chip (SoC) arrangement. The controller 120 might include a Microcontroller Unit (MCU), an Application Specific Integrated Chip (ASIC), or other forms of silicon based embedded chips.

The encoder 110 can be a magnetic encoder, an optical encoder, or the like. The term "magnetic encoder" refers to a type of rotary encoder that uses one or more sensors to identify changes in magnetic fields from a rotating device (e.g., a magnetized wheel or ring, or the like) and generates signals indicating the angular position of the rotating device. The term "optical encoder" refers to a type of rotary encoder that uses one or more sensors to identify changes in light associated with the rotating device (e.g., a code wheel, code disc, or the like) and generates signals indicating an angular position of the rotating device. In some embodiments, the encoder 110 is an absolute encoder which comprises a sensor that measures an absolute or true angular position of the rotating device of the encoder and generates a unique position value or signal based on the absolute or true angular position of the rotating device.

Figure 2A:
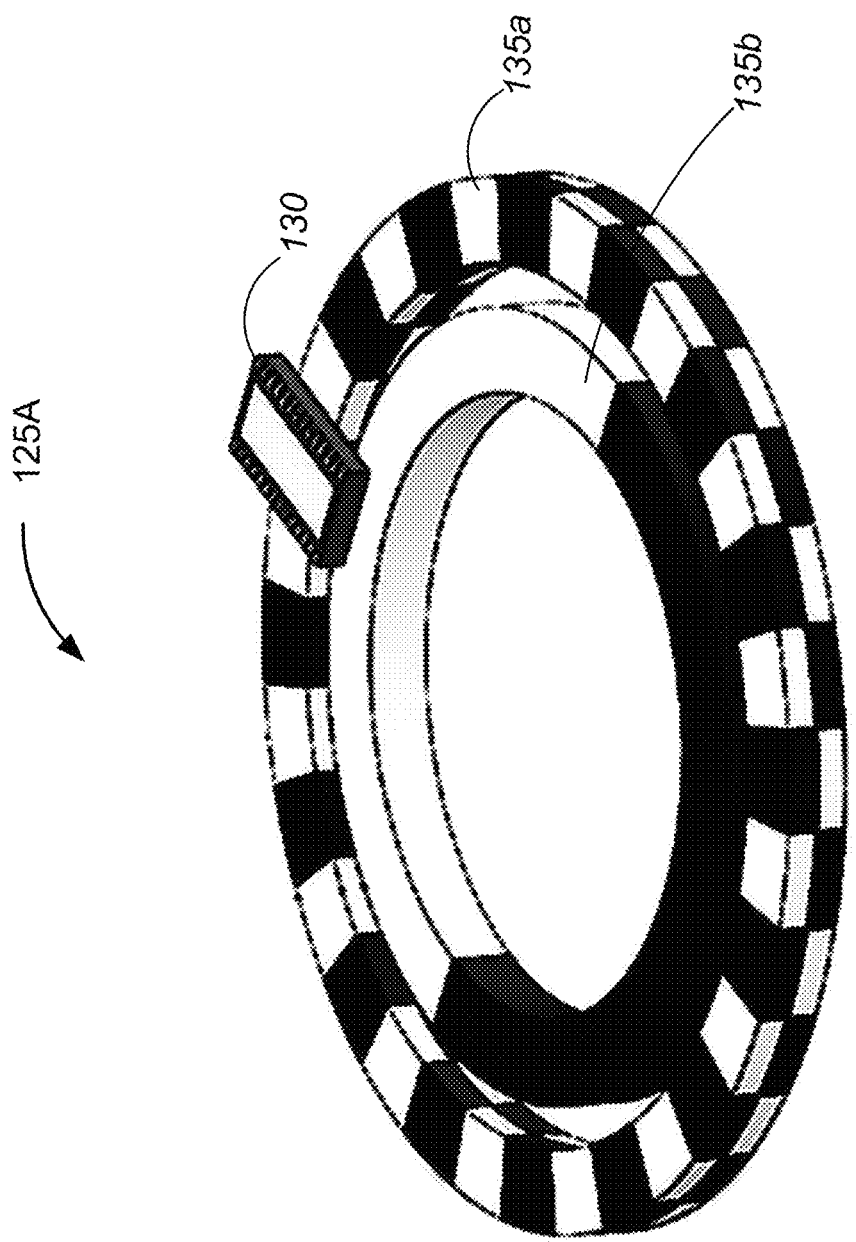
FIG. 2A is a perspective view of an exciter of a magnetic encoder, in accordance with various embodiments.

In various instances, the exciter 125 is a rotating device of the encoder 110. In some cases, the exciter 125 is coupled to the rotating body 105. When the rotating body 105 rotates, the exciter 125 also rotates. The exciter 125 can be a different rotating device depending on whether the encoder is a magnetic encoder, an optical encoder, or the like. For example, as indicated above and as shown in FIG. 2A, the exciter 125a can be a magnetized wheel or ring or the like for a magnetic encoder. In the case of FIG. 2A, there are two magnetic wheels 135a and 135b comprising one or more magnets. The term "magnet" may refer to a material or object that produces a magnetic field (e.g., a force field that either pulls or repels certain materials, such as nickel or iron) and can include, without limitation, a permanent magnet, a temporary magnet, an electromagnet, or the like. Each magnet may have one or more pole pairs. A "pole pair" may refer to a pair of north and south poles, which are associated with the direction of the magnetic field.

Alternatively, as indicated above and as shown in FIG. 2B, the exciter 125b can be a code wheel or code disc 140 for an optical encoder. For an optical encoder, the encoder might further include light source 145 (e.g., a light emitting diode, a laser, or the like) and one or more openings 150 shown in FIG. 2B. The one or more openings 150 may be different shapes, sizes, or the like. In some cases, the one or more openings 150 might be one or more transparent pieces of material. The light source 145 might be configured to emit light toward the sensor 130 (not shown in FIG. 2B). As the exciter 125b rotates, the light from the light source 145 can be transmitted through the one or more openings 150 in exciter 125b toward the first sensor 130.

The first sensor 130 is positioned and configured to detect a position of the exciter 125 and identify changes in the angular position of the exciter 125. Based on the position of the exciter 125, the first sensor 130 generates one or more signals indicating the angular position of the exciter 125. In some embodiments, the exciter 125 rotates relative to the first sensor 130 that is stationary.

In the case of a magnetic encoder, the first sensor 130 detects a position of the exciter 125a by detecting a magnetic field associated with the exciter 125a as the exciter 125a rotates. The first sensor 130 can include a Hall effect sensor or other type of magnetoresistive or magnetosensitive sensor, such as an Anisotropic Magnetoresistive (AMR) sensor, a Giant Magnetoresistive (GMR) sensor, and Tunnelling Magnetoresistive (TMR) sensor, or the like. Different magnetic fields may be formed at different positions along the exciter 125a. These different magnetic fields may vary based on the size (e.g., width, length, etc.) of the pole pairs, the number of magnets used, or the like.

In the case of an optical encoder, the first sensor 130 is configured to detect changes in light emitted from the light source 145 through the openings 150 as the exciter 125b rotates. The first sensor 130 might be a photoelectric sensor, a photodetector sensor, or the like. Different patterns of light may be formed at different positions along the exciter 125b depending on the size (e.g., width, length, etc.) of the one or more openings 150, depending on an amount of light emitted through the one or more openings 150, or the like.

In the case of the magnetic encoder where the first sensor 130 detects a magnetic field of the exciter 125a or the optical encoder where the first sensor 130 detects a light emitted from a light source through the exciter 125b, the first sensor 130 generates a signal or one or more signals based on the detected magnetic field or the detected light. Differences in the magnetic field of the exciter 125a or light emitted through the exciter 125b can be represented by different parts of the signal. The signal might include electrical signals configured in sinusoidal waveforms. In other words, the signal that is generated can include at least a sine signal and a cosine signal.

The first sensor 130 can then send those signals to the controller 120. Based on the signals generated by the first sensor 130, the controller 120 can determine the angular position of the exciter 125. In a non-limiting example, in order to determine a first position of the exciter 125, the first sensor 130 might detect a first magnetic field or a first pattern of emitted light and generate a signal based on the detected first magnetic signal or first pattern of emitted light. Next, the controller 120 might receive that signal and determine a position associated with the exciter 125 based on the signal generated from the detection of the first magnetic field or the first pattern. Based on the position of the exciter 125, the controller 120 can further determine the position of the rotating body 105 of the motor.

The temperature sensor 155 of the encoder can detect a temperature of an environment (e.g., factory, shop, warehouse, outside, etc.) in which the encoder 110 is operating. The temperature sensor 155 may be at least one of a thermocouple, resistance temperature detector, thermistor, or other temperature sensor capable of determining a temperature of an environment. In some cases, the temperature sensor is coupled to an exciter 125 of the encoder 110 or another part of the encoder 110.

Figure 3:
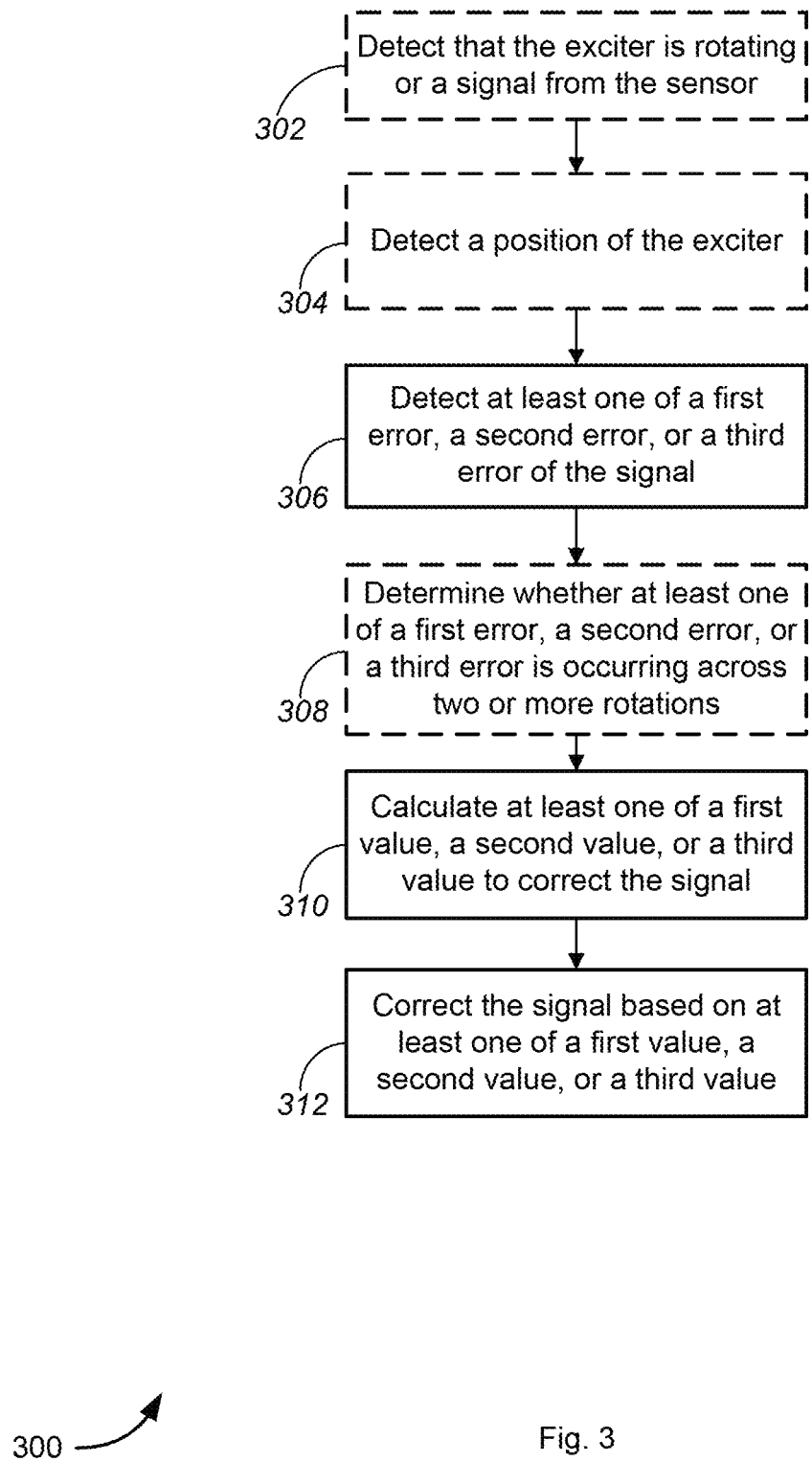
FIG. 3 is a flow diagram of a method of correcting a signal of an encoder, in accordance with various embodiments.

Over time, a detection of a position of the exciter 125 or the generation of one or more signals of the sensor 130 can become inaccurate due to changes in temperature of the environment, thermal expansion of the encoder 110 (e.g., body or housing of the encoder), exciter 125, rotating body 105, motor 115 or components of the motor 115, or the like, defects (e.g., due to wear and tear, thermal expansion, etc.) of encoder 110, the exciter 125, rotating body 105, motor 115 or components of the motor 115, or the like. In order to address this, FIG. 3 represents a process or method to stabilize or correct the operation of the encoder and account for the inaccuracies in the detection of the position of the exciter 125 or generation of the signal. This method 300 is intended to run in the background as the encoder is operating and correct a signal of the exciter as errors are detected in real-time.

Turning to FIG. 3, FIG. 3 is a flow diagram illustrating a process or a method to correct one or more errors in a signal of a sensor of an encoder, in accordance with various embodiments. This diagram merely provides an example, which should not unduly limit the scope of the claims. In some embodiments, the encoder 110 shown in FIG. 1 is capable of performing an automatic correction or stabilization method 300 described in FIG. 3. However, the method is not limited to only being performed with the encoder of FIG. 1 and can be performed by other encoders or types of encoders. In some cases, a processor or controller (e.g., processor or controller 130) of the encoder is configured to execute the method 300. In some cases, multiple controllers are configured to execute different blocks or steps of the method 300. Alternatively, a single controller is configured to execute the blocks or steps of the process 300.

In some cases, the method 300 occurs after the calibration processes described in "Automatic Calibration of Encoders" application Ser. No. 18/466,801 or another calibration method.

The process 300 can begin at optional block 302 by detecting that the exciter (e.g., exciter 125) of the encoder is rotating and/or by detecting a signal from the sensor (e.g., sensor 130). In order to rotate the exciter, the exciter might be coupled to a rotating body (e.g., rotating body 105) which may be coupled to a motor (e.g., motor 115). The motor can be turned on causing the rotating body and the exciter to rotate. A sensor 130 can detect a position of the exciter as the exciter is rotating and generate a signal based on the detected position.

In some cases, the exciter of encoder rotates at a speed that has not been predetermined by the encoder or motor. In order to determine the speed of rotation of the exciter after the exciter of the encoder starts rotating, the controller can determine a first position of the exciter and a second position of the exciter and determine an amount of time to rotate the exciter from the first position to the second position. In some cases, the controller can continuously detect a position of the exciter and/or the rotation speed of the exciter while the exciter is rotating. In this way, the controller can account for variations is a rotation speed of the exciter.

Next, the process 300 at optional block 304 can detect or sample a position of the exciter based on a signal from the first sensor (e.g., sensor 130) of the encoder. The signal that is generated by the sensor might include electrical signals configured in sinusoidal waveforms. In other words, the signal that is generated can include at least a sine signal and a cosine signal. The first sensor is configured to at least one of detect a magnetic field from one or more magnetic rings (e.g., magnetic rings 135) of the encoder or detect light emitted through one or more openings (e.g., openings 150) of the exciter from a light source (e.g., light source 145). The first sensor converts the detected magnetic field or light to a signal. The controller of the encoder may then receive the signal and determine a position of the exciter based on the signal received from the first sensor.

In some cases, the controller can continuously monitor and determine the position and rotation speed of the exciter while the encoder is operating over one or more rotation cycles based on the detected position of the exciter. A rotation cycle is a rotation of the exciter from a first position to a second position. In some cases, the first position is the same as the second position. In the case where the first position is the same as the second position, the rotation cycle of the exciter represents a full rotation of the exciter from the first position back to the first position. In other cases, the first position is not the same as the second position. In the case where the first position is not the same as the second position, the rotation cycle of the exciter can represent less or more than full rotation of the exciter from the first position back to the first position. In various embodiments, the controller can continuously monitor and determine the rotation speed and position of the exciter over one or more segments (e.g., pieces, divisions, sections, etc.) of the one or more rotation cycles.

In order to continuously monitor and determine the rotation speed and position of the exciter a moving average algorithm can be used. The moving average algorithm or filter is a calculation to analyze data points (e.g., a position of the exciter indicated by the signal generated by the sensor) by creating a series of averages of different selections of the full data set. Given a series of numbers and a fixed subset size, the first element of the moving average is obtained by taking the average of the initial fixed subset of the number series. Then the subset is modified by "shifting forward;" that is, excluding the first number of the series and including the next value in the subset. This moving average algorithm process can be applied to one or more rotation cycles of the exciter to filter out noise such as sudden angular positional deviations caused by variations (e.g., jerks, accelerations, braking, etc. affecting the rotation or the rotation speed of the exciter) in the rotation speed of the exciter through the first rotation cycle or an other rotation cycle. In other words, the moving average algorithm can be applied to signal generated by the first sensor to smooth out the signal and account for sudden variations in a position of the exciter.

Figure 5:
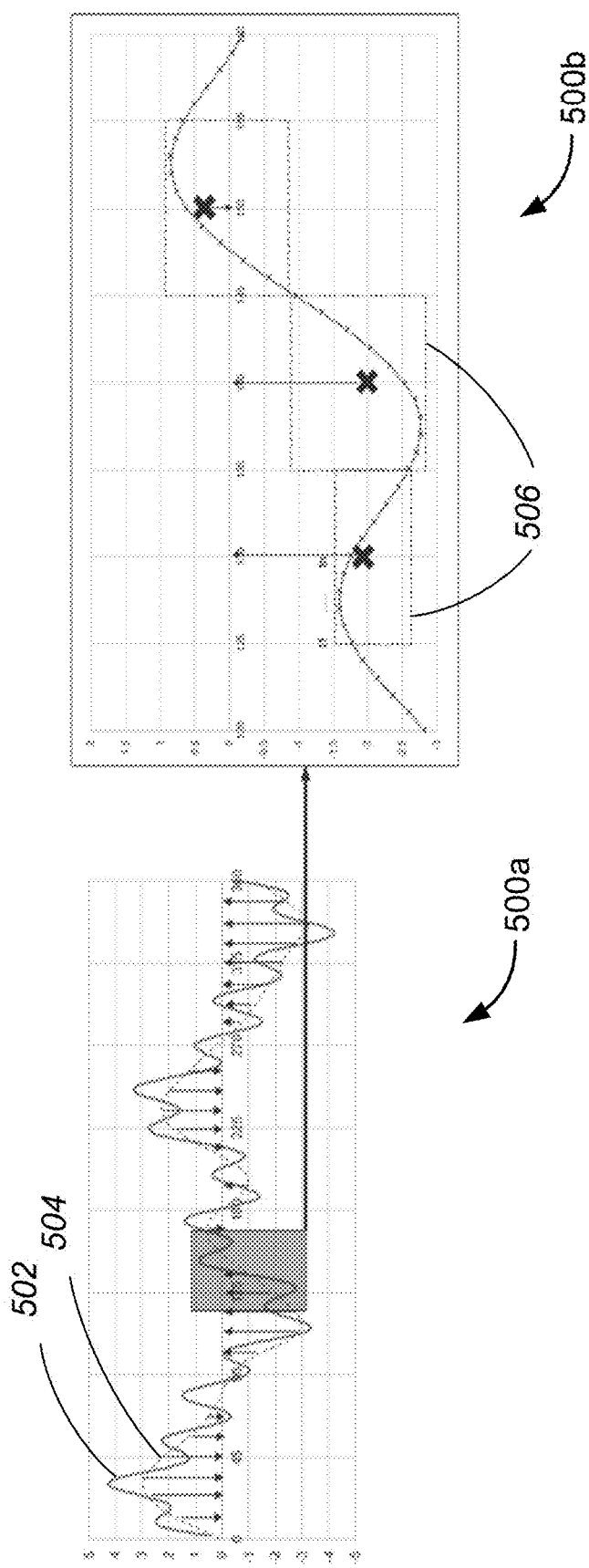
FIG. 5 is a graph illustrating the application of a moving average algorithm to a signal received from a sensor of the encoder, in accordance with various embodiments.

An example of applying a moving average algorithm to the signal received from the sensor is shown in graphs 500a and 500b of FIG. 5. As shown in graph 500a of FIG. 5, a position of the exciter may be irregular or deviate (as shown by the solid line 502) at different intervals due to variations in the rotation speed of the encoder. For example, the irregularities or deviations may be caused by a sudden motor irregular jerk or braking that could change the behavior of the signals generated by the exciter's angular rotation. By performing a moving average, as shown by the dotted line 504 in FIG. 5, the effect caused by such irregularities can be negated or smoothed. Graph 500b shows a zoomed in portion of the application of the moving average algorithm. Boxes 506 show areas of the graph where the position has been corrected based on the moving average algorithm to filter out sudden changes in the position of the exciter.

In order to more effectively apply a moving average algorithm to the signal generated by the sensor and/or monitor and determine the rotation speed and position of the exciter, the sampling frequency or detection frequency of the position of the exciter can be higher than the speed of rotation of the exciter. For example, a ratio of the sampling frequency or detection frequency versus the rotational speed of the exciter can be at least 2500 to 1. Alternatively, for each rotation cycle the sensor may detect or sample the position of the exciter at least 2500 times. In this way, the sensor can more effectively detect the position of the exciter.

The process 300 can then proceed at block 306 by detecting at least one of a first error in an offset of the signal, a second error in a gain of the signal, or a third error in a phase of the signal from the sensor. In some cases, this detection might occur over one rotation cycle or multiple rotation cycles. At least one of the first error, the second error, or the third error can occur when the signal does not match a target signal of the encoder.

Figure 4:
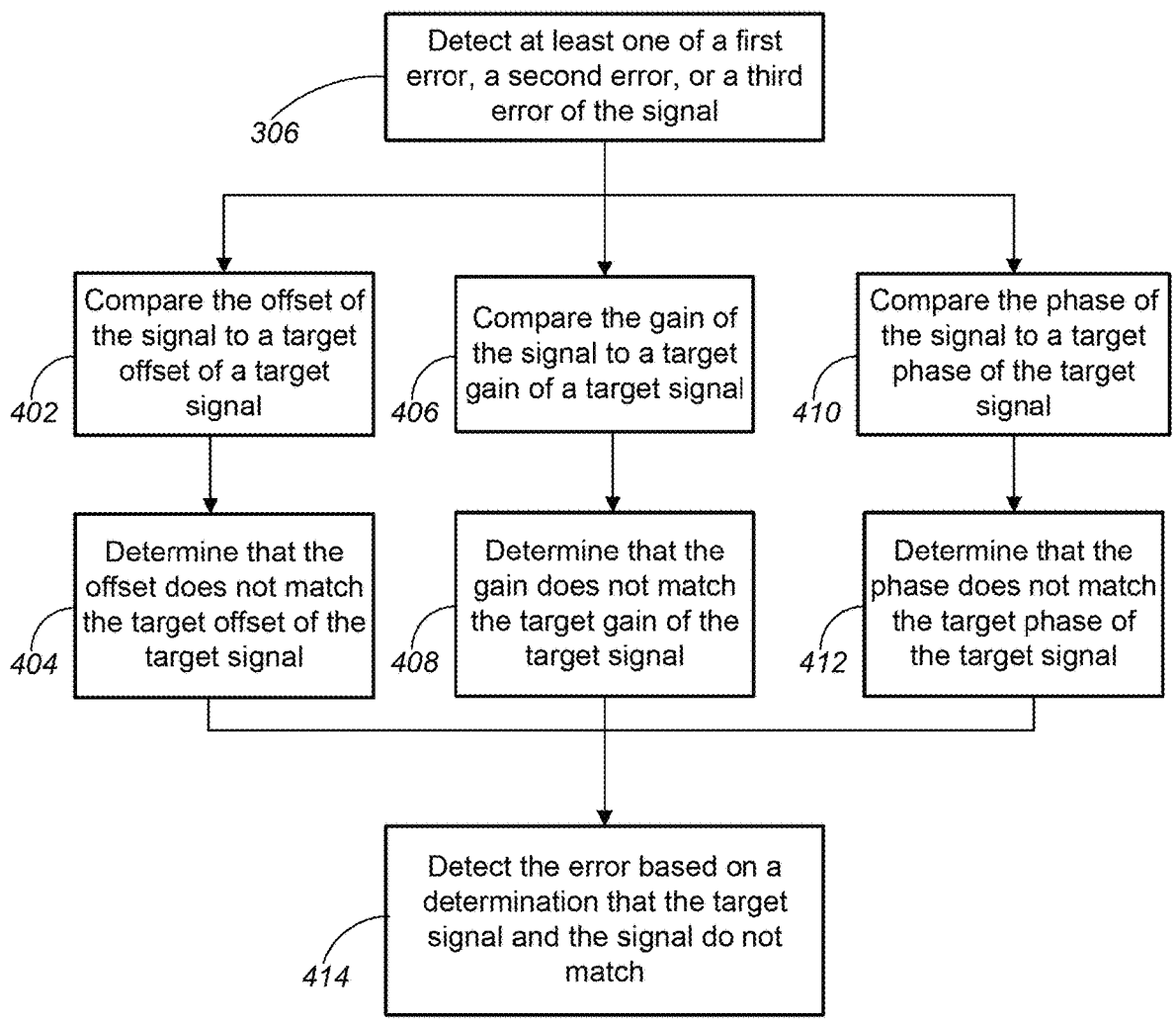
FIG. 4 is a flow diagram of a method of detecting an error in a position or rotation of an exciter of the encoder, in accordance with various embodiments.

Method 400 of FIG. 4 represents a method to determine at least one of the first error, the second error, or the third error as the exciter is rotating. This process is further described below with respect to FIGS. 6 and 7. The method 400, at block 402 can begin by comparing the offset of the signal to an offset of a target signal. In other words, the sine and cosine signals generated by the sensor are compared to a target offset of a target signal.

At optional block 404, the method can determine that the offset of the signal and the target offset of the target signal do not match. In a non-limiting example, looking at graph 700a of FIG. 7, the sine and cosine signals generated by the sensor are off the "0" which is where the offset of a target signal should be. In other words, a target signal does not have any offset so the sine and cosine signals need to be corrected back to a "0" offset. In order to determine the target offset of a target signal, a peak or valley detection of the signal can be performed. This means that a highest (max) point and lowest (min) of the peak of the sine or cosine signal can be determined. Then the following formula can be used (max+min)/2 to determine the midpoint or "0" (which is the target offset) of the sine/cosine signals. A discrete Fourier transform can also be used to detect the offset of the sine/cosine signals. For example, each and every single point within the sine or cosine signals are samples from the sensor (e.g., as shown graph 500b of FIG. 5). Each sample is spaced apart by time controlled via the clock and sampling frequency of the sensor. By utilizing a full sampled revolution of data plus time, the signals can be isolated into its base harmonics. A signal's $0^{th}$ harmonic corresponds to the midpoint of the signal. A combination of the peak and valley detection plus the discrete Fourier transform can be used to determine a target midpoint of the signal and can be compared against the offset of the signal to correct the offset of the signal. Based on this determination, the method can continue to optional block 414 and determine that an error exists in the offset of the signal.

The method 400, at block 406 can further include comparing the gain of the signal to a target gain of a target signal. In other words, the sine and cosine signals generated by the sensor are compared to a target gain of a target signal.

At optional block 408, the method can determine that the gain of the signal and the target gain of the target signal do not match. In a non-limiting example, looking at graph 700b of FIG. 7, the sine and cosine signal have a difference in the peak to peak of their signal. For example, the amplitude of the sine signal could be 0.8 and the amplitude of the cosine could be 0.9. The amplitude of the target signal could be 1.0, thus both the sine and cosine of the signal need to be corrected to 1.0. In order to determine the target gain of a target signal, a peak or valley detection of the signal can be performed. This means that a highest (max) point and lowest (min) of the peak of the sine or cosine signal can be determined. Then the following formula can be used (max-min) to determine the amplitude of the sine/cosine signals. A discrete Fourier transform can also be used to detect the gain of the sine/cosine signals. A signal's 1° harmonic amplitude corresponds the signal's amplitude. A combination of the peak and valley determination plus the discrete Fourier transform can be used to determine an amplitude of the signal and which be compared against target amplitude of the signal to correct the gain of the signal. Based on this determination, the method can continue to optional block 414 and determine that an error exists in the gain of the signal The method 400, at block 410 can further include comparing the phase of the signal to a target phase of a target signal. In other words, the sine and cosine signals generated by the sensor are compared to a target phase of a target signal.

At optional block 412, the method can determine that the phase of the signal and the target phase of the target signal do not match. In a non-limiting example, looking at graph 700c of FIG. 7, the sine and cosine signal are spaced apart more than they are expected to be. For example, the sine and cosine signals are spaced apart from each other more than 90 degrees. The phase target signal would be to have the sine and cosine signals spaced apart 90 degrees. This phase detection can be performed using a Discrete Fourier Transform where the signal 1st Harmonic Phase corresponds to signal's phase. Based on this determination, the method can continue to optional block 414 and determine that an error exists in the phase of the signal.

In some cases, for a magnetic encoder, at least one of the first error in the offset of the signal, the second error in the gain of the signal, or the third error in the phase of the signal can be determined by combining the detection of a peak or valley minimum and maximum detection of the signal with a Discrete Fourier Transform (DFT). Using this method can compute errors in harmonics of the magnetic encoder.

Turning back to FIG. 3, once at least one of the first error in the offset of the signal, the second error in the gain of the signal, or the third error in the phase of the signal has been detected in block 306, the method 300 might continue to optional block 308 and determine whether at least one of the first error, the second error, or the third error is occurring or repeating across two or more rotation cycles. By determining whether at least one of the first error, the second error, or the third error is occurring or repeating across two or more rotation cycles, noise (1) from one or more variations in the rotation speed of the exciter; (2) from the sensor detecting a position of the exciter, or the like can be filtered out. The one or more variations in the rotation speed of the exciter might be caused by sudden jerks of the motor, rotational body, or exciter, sudden braking of the motor, rotational body, or exciter, sudden accelerations of the motor, rotational body, or exciter, or other sudden irregularities in the operation of the motor, rotational body, or exciter, or the like. In other words, if the motor suddenly breaks during a first rotation cycle but not a second rotation cycle, then at least one of the first error, the second error, or the third error might not be corrected because it only occurred over one rotation cycle. Alternatively, based on a determination that at least one of the first error, the second error, or the third error is occurring over two or more rotation cycles, the controller of the encoder can determine that at least one of the first error, the second error, or the third error is repeating and should be corrected.

Based on a determination that at least one of the first error, the second error, or the third error is occurring (block 306) or that at least one of the first error, the second error, or the third error is occurring across two or more rotation cycles (optional block 308), the method 300 continues to block 310 and calculates at least one of a first value to correct the offset of the signal, a second value to correct the gain of the signal, or a third value to correct the phase of the signal to correct the signal to account for at least one of the first error, the second error, or the third error. This calculation of at least one of a first value to correct the offset of the signal, a second value to correct the gain of the signal, or a third value to correct the phase of the signal to correct the signal can occur in real time as the encoder is being used. Additionally, at least one of the first value, the second value, or the third value can be calculated independent of and/or after calibration of the encoder.

Once calculated, the method 300 continues to block 312 and corrects the signal of the first sensor based on at least one of the first value, the second value, or the third value. Correcting the signal of the sensor might include generating (e.g., by the controller, or the like) a correction signal based on at least one of the first value, the second value, or the third value and the signal generated nu the sensor.

In some cases, the signal of the first sensor can be corrected immediately. Alternatively, the signal of the first sensor can be corrected incrementally over a predetermined amount of time (e.g., 1 second, 5 seconds, 30 seconds, 1 minute, 5 minutes, or the like) or a predetermined number of rotations (e.g., 1 rotation, 2 rotations, 5 rotations, 10 rotations, or the like). Gradual or incremental correction can be implemented when at least one of the first error, the second error, or the third error occurs over one rotational cycle and has not yet been determined whether at least one of the first error, the second error, or the third error is due to noise or a repeated error over multiple rotation cycles. By gradually correcting the signal of the sensor, the position of the exciter is not dramatically changed when the error is due to noise. If the error is due to noise and does not repeat, then the signal can easily be corrected back to a state that it was in before at least one of the first value, the second value, or the third value was used to correct the signal. Alternatively, in other cases, when the encoder determines that the error is repeating over two or more or a predetermined number of rotation cycles, then the signal might be immediately corrected to accurately detect the position of the exciter.

In some cases, in order to correct the signal based on at least one of the first value, the second value, or the third value, at least one of the first value, the second value, or the third value is added to or combined with a corresponding correction value determined during a calibration cycle (e.g., calibration processes described in "Automatic Calibration of Encoders" application Ser. No. 18/466,801 and "Automatic Calibration of Encoders Based on Temperature" application Ser. No. 18/466,817 or another calibration method) of the encoder. At least one of the first value, the second value, or the third value can be combined or added to the correction values from the calibration cycle incrementally over a predetermined amount of time (e.g., 1 second, 5 seconds, seconds, 1 minute, 5 minutes, or the like) or a predetermined number of rotations (e.g., 1 rotation, 2 rotations, 5 rotations, 10 rotations, or the like).

In some cases, at least one of the first value, the second value, or the third value can be added to a look up table for the encoder. The look up table can be used by the encoder to compute an angular position of the exciter based on the detected signal from the first sensor. In some cases, at least one of the first value, the second value, or the third value can be associated with a temperature detected by a temperature sensor (e.g., temperature sensor 155, or the like) so that, when the encoder detects the temperature or a temperature within a predetermined range, the encoder retrieves at least one of the first value, the second value, or the third value associated with the detected temperature to correct the signal.

By implementing method 300 described above, an encoder can seamlessly address misalignment and automatically correct itself to provide an accurate angular position of the exciter as the exciter rotates during use.

Figure 6:
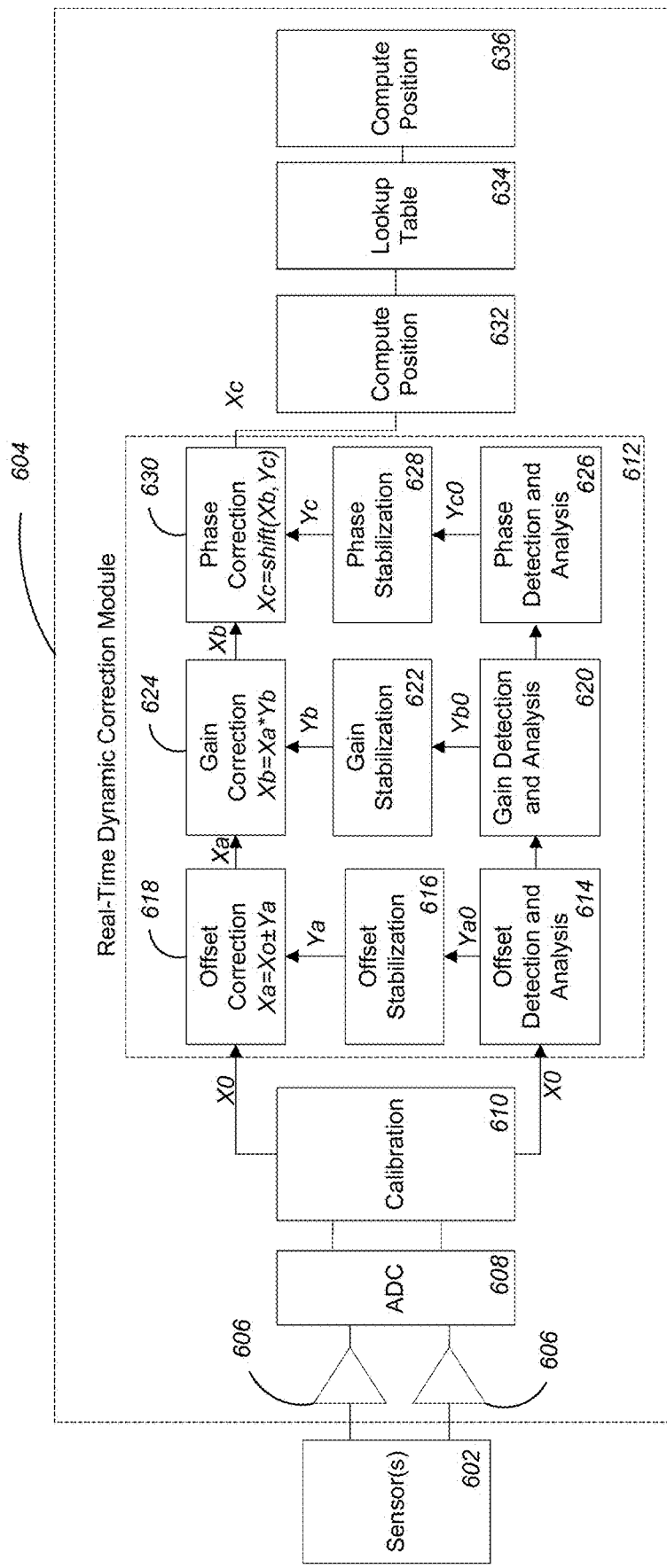
FIG. 6 is a simplified block diagram illustrating components of exemplary encoder, in accordance with various embodiments.

Turning to FIG. 6, FIG. 6 is a simplified block diagram illustrating components of exemplary encoders according to embodiments of the present disclosure. These diagrams merely provide an example, which should not unduly limit the scope of the claims. One of ordinary skill in the art would recognize many variations, alternatives, and modifications. For example, one or more steps may be added, removed, repeated, modified, replaced, overlapped, and/or rearranged, and should not limit the scope of the claims. As an example, various functional blocks may be implemented using one or more hardware components, depending on the implementation. For example, processor 430 may include both analog components (e.g., analog front end, or AFE) and digital signal processing components.

As shown in FIG. 6, the encoder 600 includes one or more sensors 602. The one or more sensors 602 might be similar to first sensor 130 of FIG. 1. The one or more sensors 602 are configured to detect a position (e.g., an angular position) of an exciter (not shown in FIG. 6).

In some embodiments, the one or more first sensors 602 generate a corresponding signal associated with a position of the exciter. In an example, the corresponding signal may include a set of analog signals (e.g., differential sine/cosine signals) associated with an angular position of the exciter.

In order to determine the angular position of the exciter, the signal may be transmitted to a processor 604 (e.g., a microcontroller, a microprocessor, or the like) for further signal processing and computing. For example, processor 604 includes one or more amplifiers 606, which are configured to amplify the signal(s) and provide amplified signal(s). The term "amplifier" may refer to an electronic element that can increase the magnitude of a signal (e.g., a time-varying voltage or current) and can include, without limitations, a transistor amplifier, an operational amplifier, a differential amplifier, a differential difference amplifier, and/or the like.

Processor 604 includes an analog-to-digital converter (ADC) 608 configured to convert the first signal and the second signal to digital signals. The term "analog-to-digital converter" may refer to an electronic device that converts an analog signal into a digital signal. ADC 608 may include, but is not limited to, a flash ADC, a dual-slope ADC, a successive approximation ADC, and/or the like. In some embodiments, ADC 608 is configured to convert the amplified signal(s) to digital signal(s).

In some cases, the processor 604 might further include an optional calibration module 610 capable of performing a calibration process to calibrate the encoder. The calibration module might be capable of performing the calibration process described in in "Automatic Calibration of Encoders" application Ser. No. 18/466,801 and "Automatic Calibration of Encoders Based on Temperature" application Ser. No. 18/466,817 or another calibration method).

After calibration and during use of the encoder, a real-time dynamic correction module 612 of the processor 604 can be implemented to correct a signal from the sensor(s) 602 in real-time as the encoder is operating. This process can be similar to the process described with respect to FIG. 3. In some cases, the offset, gain, and phase of the signal can be corrected in real-time using the real-time dynamic correction module 608 of the processor 604.

The offset voltage is the voltage that appears at the output of an amplifier when the input is zero. In order to correct the signal(s) (X0), the signal from the sensor 602 is analyzed to calculate its $V_{mid}$ using a peak valley detection. The $V_{mid}$ is determined by $(X_{0,max}+X_{0,min})/2$ at offset detection and analysis module 614. The $V_{mid}$ can also be determined using a discrete Fourier transform where the signal's $0^{th}$ harmonic amplitude corresponds to $V_{mid}$. In some cases, the $V_{mid}$ can be a combination of the $V_{mid}$ determined by the peak/valley determination and the discrete Fourier transform. The offset detection and analysis module 614 then determines a difference between detected $V_{mid}$ versus targeted $V_{mid}$ (e.g., what $V_{mid}$ should be at a targeted time or a targeted position) to calculate an offset correction value or first stabilization value ($Y_{a0}$) to correct an offset of the signal. An optional correction value (Ya) can then be calculated by an offset stabilization module 606 by dividing the first stabilization value into one or more increments to gradually correct the offset of the signal over a predetermined amount of time or a predetermined number of rotations. Alternatively, the second stabilization value (Ya0) can be added directly to the signal to correct the offset of signal. A dynamic offset correction module 618 then applies the correction value (Ya or Ya0) to the signal to correct $V_{mid}$ or offset of the signal.

The correction of the offset can occur after the signal has already been corrected for at least one of gain or phase or before the signal has been corrected for at least one of gain and phase. Alternatively, the correction of the offset can occur in parallel with the correction of the gain and/or phase. This process to identify and correct offset mismatch 702 is shown in graphs 7a and 7b of FIG. 7.

The gain of the signal is the extent to which an amplifier boosts the strength of a signal. In order to correct gain or peak-to-peak voltage Vpp, gain detection and analysis module 620 can analyze the signal(s) to determine the signal(s) Vpp, using peak valley detection, by (Xa,max−Xa,min). Alternatively, in some cases, Vpp can be determined using a discrete Fourier transform where a signal's $1^{st}$ harmonic amplitude corresponds to a signal's Vpp. In some cases, both the peak/valley detection method and discrete Fourier transform can be used to determine the Vpp of the signal. The gain detection and analysis module 620 then determines a difference between detected Vpp versus targeted Vpp (e.g., what Vpp should be at a targeted time or a targeted position for example 1.0 in graph 700c of FIG. 7) to calculate a gain correction value or second stabilization value (Yb0) to correct a gain of the signal. An optional correction value (Yb) can then be calculated by a gain stabilization module 622 by dividing the first stabilization value into one or more increments to gradually correct the gain of the signal over a predetermined amount of time or a predetermined number of rotations. Alternatively, the second stabilization value (Yb0) can be added directly to the signal to correct the gain of signal. A dynamic gain correction module 624 then applies the correction value (Yb0 or Yb) to the gain of the signal to correct gain or Vpp of the signal. The correction of the gain can occur after the signal has already been corrected for at least one of offset and phase or before the signal has been corrected for at least one of offset and phase. Alternatively, the correction of the gain can occur in parallel with the correction of the offset and/or phase. This process to identify and correct gain 704 is shown in graph 7b of FIG. 7. Additionally, in graph 7b the offset mismatch 702 has been corrected.

The phase is the position of a wave at a point in time (instant) on a waveform cycle. In order to correct a phase, phase detection and analysis module 626 can analyze the signal(s) to determine the phase (e.g., this detection may be done by a Discrete Fourier Transform where the signal 1st Harmonic Phase corresponds to signal's phase or the like). The gain detection and analysis module 626 then determines a difference between a detected phase versus targeted phase (e.g., what the phase should be at a targeted time or a targeted position) to calculate a phase correction value or second stabilization value (Yc0) to correct a gain of the signal. In some cases, this formula shift (Xb, Yc)=Xb·cos (Yc)+shift (Xb, −90°)·sin (Yc) can be used to correct a phase of the signal. An optional correction value (Yc) can then be calculated by a phase stabilization module 628 by dividing the third stabilization value into one or more increments to gradually correct the gain of the signal over a predetermined amount of time or a predetermined number of rotations. Alternatively, the third stabilization value (Yc0) can be added directly to the signal to correct the phase of signal. A dynamic phase correction module 630 then applies the correction value (Yc0 or Yc) to the phase of the signal to correct phase of the signal. The correction of the phase can occur after the signal has already been corrected for at least one of offset and gain or before the signal has been corrected for at least one of offset and gain. This process to identify and correct phase 706 is shown in graph 7c of FIG. 7.

Alternatively, the correction of the phase can occur in parallel with the correction of the offset and/or gain. Additionally, in graph 7c the offset mismatch 702 and gain mismatch 704 has been corrected.

Figure 7:
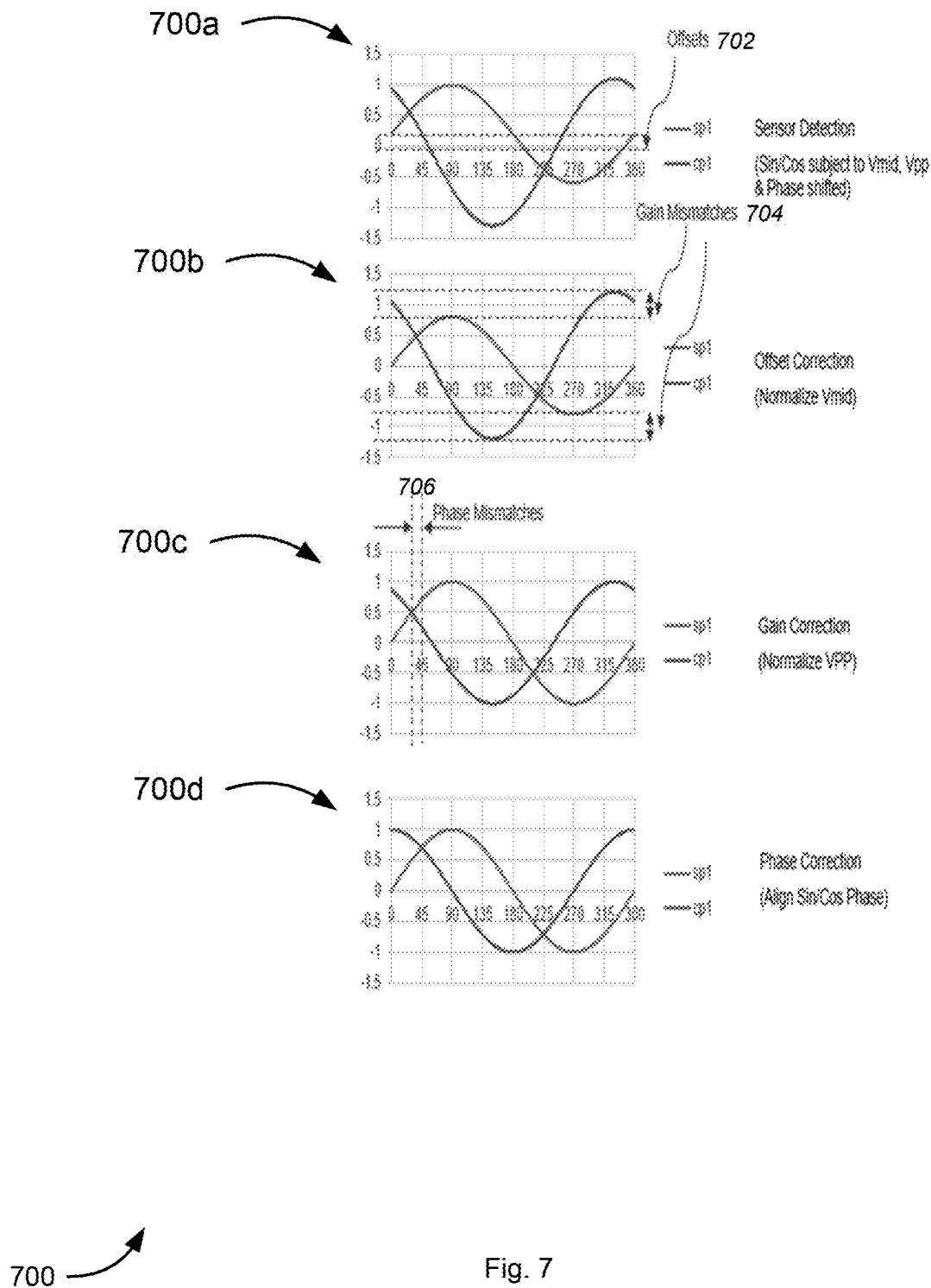
FIG. 7 is graphs illustrating correcting an offset, phase, and gain of a signal of a sensor, in accordance with various embodiments.

Graph 7d of FIG. 7 shows the corrected signal when the signal has been corrected for offset mismatch 702, gain mismatch 704, and phase mismatch 706.

Once offset, gain, and phase of the signal have been corrected using the first stabilization value, the second stabilization value, and the third stabilization value, the processor 604 can determine an angular position of the encoder using compute angular position module 632. The processor 604 can further save the stabilization values in a look up table 634 for the encoder and use the look up table to compute the angular position of the exciter using compute angular position module 636 when the encoder is in use or the next time the encoder is in operation.

Figure 8:
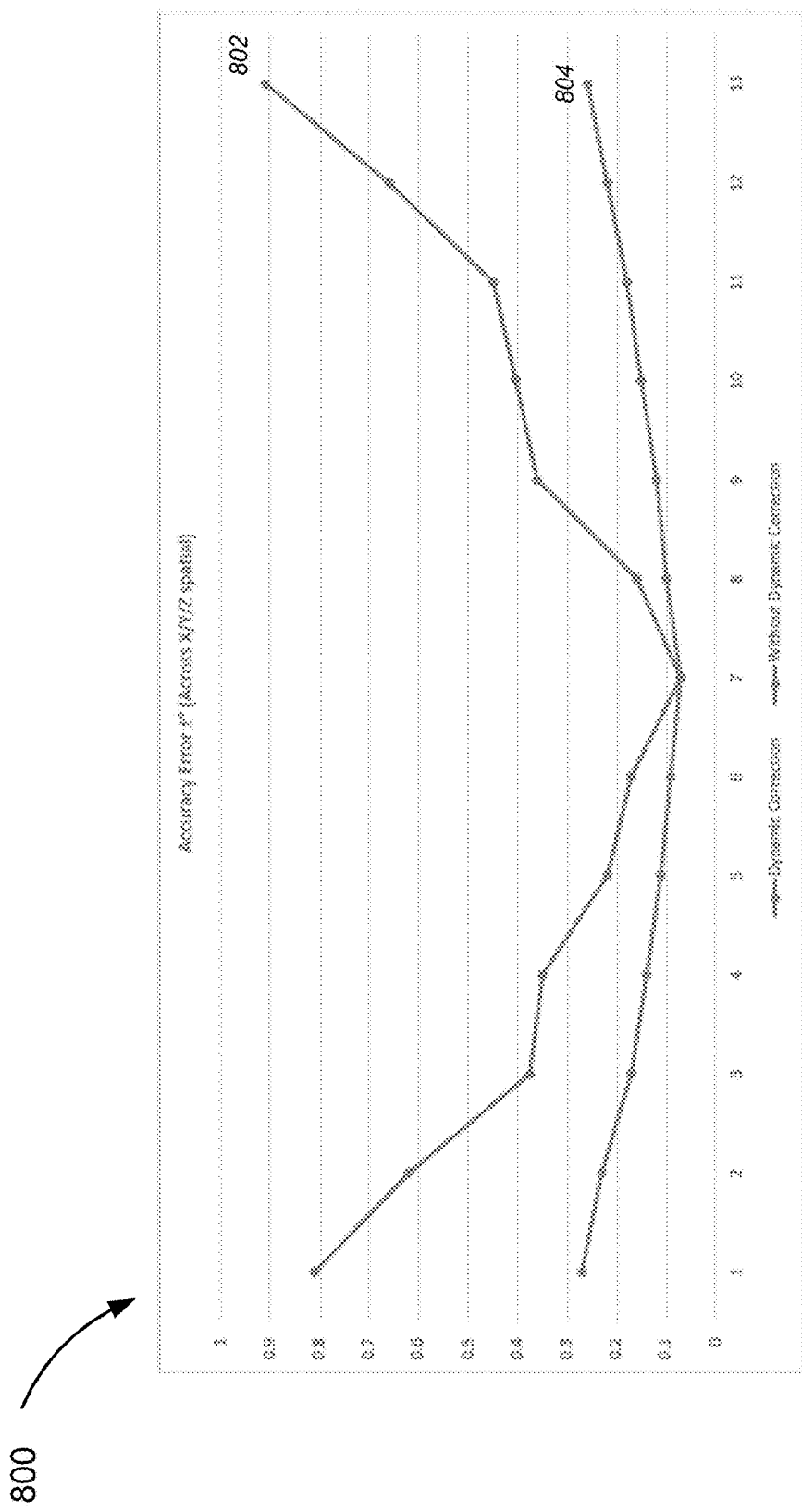
FIG. 8 is a graph illustrating the correction of the position of an exciter of an encoder using the method of FIG. 3, in accordance with various embodiments.

FIG. 8 shows the effect of applying the method of FIG. 3 or the processor of FIG. 6, while the encoder is in use. As shown in FIG. 8, without updating a position 802 of the encoder over time, the error in the position of the encoder is significantly higher than when a position 804 of the exciter is updated over time using the method of FIG. 3 and further described with respect to FIG. 6.

The techniques and processes described above with respect to various embodiments may be used to continuously update and correct in real time the position of the exciter 125 of the encoder 110, and/or components thereof, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Referring generally again to FIGS. 1, 3, and 4, for the purposes of the present disclosure, the term "controller," "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). Furthermore, the memory may include any storage medium known in the art suitable for storing program instructions executable by the associated processor. For example, the memory medium may include a non-transitory memory medium. By way of another example, the memory medium may include, but is not limited to, a read-only memory (ROM), a random-access memory (RAM), a magnetic or optical memory device (e.g., disk), a solid-state drive and the like. It is further noted that memory medium may be housed in a common controller housing with the processor. In embodiments, the memory medium may be located remotely with respect to the physical location of the processor.

In the present disclosure, the methods, operations, and/or functionality disclosed may be implemented as one or more steps switching hardware systems and/or as sets of instructions or software readable by a device sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

What is claimed is:

1. An encoder comprising:
an exciter;
a sensor configured to detect a position associated with the exciter and generate a signal based on the position; and
a controller configured to:
receive the signal from the sensor;
detect, as the exciter is rotating, at least one of a first error in an offset of the signal, a second error in a gain of the signal, and a third error in a phase of the signal from the sensor using at least a moving algorithm creating a series of averages;
based on the detection of at least one of the first error, the second error, or the third error, calculate at least one of a first value to correct the offset of the signal, a second value to correct the gain of the signal, and a third value to correct the phase of the signal; and
correct the signal, incrementally over a predetermined amount of time to avoid overcorrection due to noise, based on at least one of the first value, the second value, or the third value.

2. The encoder of claim 1, wherein the detection of at least one of the first error, the second error, or the third error in the rotation of the exciter, the calculation of at least one of the first value, the second value, or the third value to correct the signal, and the correction of the signal occurs as the exciter is rotating.

3. The encoder of claim 2, wherein correcting the signal based on at least one of the first value, the second value, or the third value occurs over a predetermined amount of time.

4. The encoder of claim 2, wherein correcting the signal based on at least one of the first value, the second value, or the third value occurs over a predetermined number of rotations of the exciter.

5. The encoder of claim 2, wherein correcting the signal based on at least one of the first value, the second value, or the third value comprises dividing at least one of the first value, the second value, or the third value and correcting the signal over a predetermined number of rotations based on the dividing of the least one of the first value, the second value, or the third value.

6. The encoder of claim 1, wherein the detection of at least one of the first error, the second error, or the third error and the calculation of at least one of the first value, the second value, or the third value to correct the signal occurs after a calibration of the encoder.

7. The encoder of claim 6, wherein at least one of the first value, the second value, or the third value is combined with a corresponding value determined by a calibration of the encoder.

8. The encoder of claim 1, wherein the detection of at least one of the first error, the second error, or the third error comprises detecting the first error, the second error, and the third error, and wherein the correction of the signal comprises first correcting the first error, then correcting the second error, then correcting the third error.

9. The encoder of claim 8, wherein first correcting the first error, then correcting the second error, the correcting the third error occurs over a predetermined amount of time.

10. The encoder of claim 8, wherein first correcting the first error, then correcting the second error, the correcting the third error occurs over a predetermined number of rotations.

11. The encoder of claim 1, wherein detecting at least one of the first error, the second error, or the third error comprises:
   determining based on the signal received from the sensor that the signal and a target signal of the sensor does not match; and
   based on a determination that the signal and the target signal do not match, detecting at least one of the first error, the second error, or the third error as the exciter is rotating.

12. The encoder of claim 1, wherein the controller is further configured to:
   determine at least one of the first error, the second error, or the third error is occurring over a predetermined number of rotation cycles; and
   based on the determination that at least one of the first error, the second error, or the third error is occurring over the predetermined number of rotation cycles, calculate at least one of the first value, the second value, or the third value to correct the signal to account for the at least one of the first error, the second error, or the third error and correcting the signal based on the at least one of the first value, the second value, or the third value.

13. The encoder of claim 1, wherein at least one of the first error, the second error, or the third error is detected by combining a peak and valley detection of the signal with a Discrete Fourier Transform (DFT).

14. A method for correcting an error in a signal of an encoder, the method comprising:
   detecting the signal from a sensor of the encoder detecting a position of an exciter of the encoder;
   detecting, as the exciter is rotating, at least one of a first error in an offset of the signal, a second error in a gain of the signal, or a third error in a phase of the signal from the sensor using at least a moving algorithm creating a series of averages;
   based on the detection of at least one of the first error, the second error, or the third error, calculating at least one of a first value to correct the offset of the signal, a second value to correct the gain of the signal, or a third value to correct the phase of the signal; and
   correcting, incrementally over a predetermined amount of time to avoid overcorrection due to noise, the signal based on at least one of the first value, the second value, or the third value.

15. The method of claim 14, wherein the detection of at least one of the first error, the second error, or the third error in the rotation of the exciter, the calculation of at least one of the first value, the second value, or the third value to correct the signal, and the correction of the signal occurs as the exciter is rotating.

16. The method of claim 14, wherein correcting the signal based on at least one of the first value, the second value, or the third value occurs over a predetermined amount of time.

17. The method of claim 14, wherein correcting the signal based on at least one of the first value, the second value, or the third value occurs over a predetermined number of rotations of the exciter.

18. The method of claim 14, wherein the detection of at least one of the first error, the second error, or the third error and the calculation of at least one of the first value, the second value, or the third value to correct the signal occurs after a calibration of the encoder.

19. The method of claim 14, wherein the detection of at least one of the first error, the second error, or the third error comprises detecting the first error, the second error, and the third error, and wherein the correction of the signal comprises first correcting the first error, then correcting the second error, the correcting the third error.

20. An encoder comprising:
   an exciter;
   a sensor configured to detect a position associated with the exciter and generate a signal based on the position; and
   a processor configured to:
      detect, as the exciter is rotating, at least one of a first error in an offset of the signal, a second error in a gain of the signal, and a third error in a phase of the signal from the sensor using at least a moving algorithm creating a series of averages;
      determine at least one of the first error, the second error, or the third error is occurring across two or more rotation cycles;
      based on a determination that at least one of the first error, the second error, or the third error is occurring across two or more rotation cycles, calculate at least one of a first value to correct the offset of the signal, a second value to correct the gain of the signal, or a third value to correct the phase of the signal; and
      correct the signal, incrementally over a predetermined amount of time to avoid overcorrection due to noise, based on at least one of the first value, the second value, or the third value.

* * * * *